(12) United States Patent
Schneider et al.

(10) Patent No.: US 12,732,202 B2
(45) Date of Patent: Sep. 8, 2026

(54) METHOD AND DEVICE FOR EVALUATING A SIGNAL

(71) Applicant: Vitesco Technologies GmbH, Regensburg (DE)

(72) Inventors: Klaus-Dieter Schneider, Lappersdorf (DE); Martin Meier, Regensburg (DE); Felix Zeis, Burglengenfeld (DE)

(73) Assignee: Vitesco Technologies GmbH, Regensburg (DE)

( * ) Notice: Subject to any disclaimer, the term of this patent is extended or adjusted under 35 U.S.C. 154(b) by 81 days.

(21) Appl. No.: 18/497,422

(22) Filed: Oct. 30, 2023

(65) Prior Publication Data

US 2024/0063804 A1 Feb. 22, 2024

Related U.S. Application Data

(63) Continuation of application No. PCT/EP2022/059584, filed on Apr. 11, 2022.

(30) Foreign Application Priority Data

Apr. 30, 2021 (DE) .................... 10 2021 204 357.7

(51) Int. Cl.
*H03M 1/06* (2006.01)

(52) U.S. Cl.
CPC ................................ *H03M 1/0629* (2013.01)

(58) Field of Classification Search
CPC .................................................. H03M 1/0629
See application file for complete search history.

(56) References Cited

U.S. PATENT DOCUMENTS

| | | | | |
|---|---|---|---|---|
| 6,163,758 | A | 12/2000 | Sullivan | |
| 6,493,450 | B1 * | 12/2002 | Scheuer | H03G 3/34 455/222 |
| 7,437,624 | B2 | 10/2008 | Miller | |
| 9,983,032 | B1 * | 5/2018 | Kraver | G01R 27/26 |
| 2002/0180498 | A1 | 12/2002 | Leary | |
| 2003/0127071 | A1 | 7/2003 | Sauler | |
| 2012/0268397 | A1 | 10/2012 | Lee | |

(Continued)

FOREIGN PATENT DOCUMENTS

| | | | |
|---|---|---|---|
| CN | 1238502 | A | 12/1999 |
| CN | 1703855 | A | 11/2005 |

(Continued)

OTHER PUBLICATIONS

Brykin, et al; Control of Elongated Material Rate; 2017 International Conference on Industrial Engineering Applications and Manufacturing (ICIEAM).

*Primary Examiner* — Benyam Haile

(57) ABSTRACT

The disclosure relates to a method and a device for evaluating a signal. The signal is provided from a signal source via a signal conditioning unit to a microcontroller for signal evaluation. The method includes detecting the signal from the signal source and transmitting the signal to the signal conditioning unit, which has an anti-aliasing filter. The method also includes filtering the signal by the anti-aliasing filter, which is set on the basis of the signal to be detected and providing the filtered signal to the microcontroller. The method also includes processing and evaluating the filtered signal in the microcontroller.

10 Claims, 1 Drawing Sheet

(56) References Cited

U.S. PATENT DOCUMENTS

| | | | |
|---|---|---|---|
| 2015/0285887 | A1 | 10/2015 | Bollenbeck |
| 2018/0172750 | A1 | 6/2018 | Rajagopal |

FOREIGN PATENT DOCUMENTS

| | | | |
|---|---|---|---|
| DE | 102005014241 | A1 | 10/2006 |
| KR | 20120268397 | A1 | 10/2012 |
| WO | 2012158938 | A1 | 11/2012 |

* cited by examiner

METHOD AND DEVICE FOR EVALUATING A SIGNAL

CROSS-REFERENCE TO RELATED APPLICATIONS

This application claims the benefit of PCT Application PCT/EP2022/059584, filed Apr. 11, 2022, which claims priority to German Application 10 2021 204 357.7, filed Apr. 30, 2021. The disclosures of the above applications are incorporated herein by reference.

TECHNICAL FIELD

The disclosure relates to a method and a device for evaluating a signal. The signal is provided from a signal source via a signal conditioning unit to a microcontroller for signal evaluation. The signal evaluation may, for example, include a measurement of an amplitude, a frequency or a load cycle of a noisy or disrupted PWM signal.

BACKGROUND

In conventional signal evaluation by a microcontroller, first the signal is detected at a signal source, then supplied by way of transmission elements, such as cables or lines, for example, to a signal conditioning unit which preprocesses the signal, before, in turn, the signal processed by the signal conditioning unit is supplied to the microcontroller for signal evaluation. From the signal detection, via the signal transmission and also during the signal preprocessing in the signal conditioning unit, interference can interfere with or contribute noise to the signal. In conventional devices for signal evaluation, the signal conditioning unit is consequently realized as hardware in such a manner that level matching of the input signal is adapted to a voltage range of the microcontroller. In this regard, a band-pass filter, for example a low-pass filter can be provided, which removes high-frequency interference from the signal. In addition, the signal conditioning unit may have comparators or Schmitt triggers in order to obtain sufficient signal-to-noise ratio with respect to the switching threshold of a timer for measuring a frequency or a load cycle. For adaptation to a signal property, sometimes also a plurality of comparators with different switching thresholds are implemented or different switching thresholds are provided at the comparator used. Hardware solutions of this type or the individual components are intensive in terms of installation space and fault-prone, as a result of which the signal evaluation may be disrupted or impaired. The conventional devices or the methods with which the signal evaluation is carried out by way of the conventional device are sensitive with respect to signal interference and edge smoothing and therefore amplitude and also timing distortion when using lower order input filters. In addition, high material costs and a larger, necessary printed circuit board area result due to the different components. In addition, a higher software outlay may exist if case-specific switchover of limit values or comparators is necessary.

The disclosure is therefore to create a method and a device in which evaluation of a signal can be carried out comparatively easily with constant or improved quality of the signal evaluation.

SUMMARY

One aspect of the disclosure provides a method for evaluating a signal that includes the steps listed below. For signal evaluation, the signal is provided from a signal source via a signal conditioning unit to a microcontroller for signal evaluation. The signal source is the location or the region at which the signal is detected, for example, by way of a sensor. The signal conditioning unit is a unit which is designed to process or to condition the signal before it is supplied to the microcontroller for signal evaluation. The microcontroller is designed to evaluate the signal.

The method includes detecting the signal from the signal source and transmitting the signal to the signal conditioning unit, which has an anti-aliasing filter. According to this method step, first the signal from the signal source is detected and transmitted to the signal conditioning unit. The signal is filtered by way of the anti-aliasing filter. The anti-aliasing filter is a filter which is designed to reduce the bandwidth of the signal in order to fulfill the Nyquist-Shannon theorem over the relevant bandwidth. The anti-aliasing filter is a band-pass filter in a comparatively simple form (first order RC low pass) and therefore represents the implementation which is both most cost-effective and most efficient in terms of surface area on the printed circuit board.

The method also includes filtering the signal by way of the anti-aliasing filter, which is set on the basis of the signal to be detected. According to this method step, the signal from the signal source is filtered by way of the anti-aliasing filter. In this case, the anti-aliasing filter is set in such a manner that the signal remains as unfiltered as possible in the relevant bandwidth or that this range can advantageously be evaluated accurately for further signal evaluation.

Additionally, the method includes processing the filtered signal in the microcontroller. The filtered signal is processed by way of the following steps. The filtered signal provided to the microcontroller is processed further for signal evaluation according to the following method steps.

In some examples, the method includes digitizing the filtered signal by way of an analog-to-digital converter, as a result of which discrete values are generated. According to this step, discrete values are generated from the filtered signal by way of the AD converter, where the discrete values are stored in a memory for example.

The method also includes comparing the discrete values that are generated with a predefined threshold value or range, where the comparison is carried out by way of a configurable digital comparator. According to this method step, the individual discrete values that are generated from the digitization are compared with a predefined range or a predefined threshold value. The threshold value or the range may, for example, also be a limit band, a model or a characteristic map. In some examples, the configurable digital comparator may be configurable by way of software.

The method also includes transmitting the result of the comparison to a timer system. According to this method step, the comparison result is transmitted to the timer system inside the microcontroller.

The method also includes storing the individual discrete values in a predefined memory area if the individual discrete values are in each case greater than the predefined threshold value or the predefined range or fulfill a comparison criterion, where the storage is initiated by the timer system. According to this method step, based on the comparison which was carried out previously, storage of the individual discrete values is initiated by way of the timer system if the respective individual discrete values have fulfilled the comparison criterion. The comparison criterion is, for example, that the individual discrete values are in each case greater than the predefined threshold value or the predefined range. It is also conceivable according to a different example that the comparison criterion includes falling below a predefined threshold value or the predefined range, or that the comparison criterion is breaking out of a predefined limit band.

The method also includes evaluating the discrete values of the signal, which are stored in the predefined memory area. From the predefined memory area, functional software of the microcontroller may undertake the evaluation for determining an amplitude, a frequency or other parameters of the signal for example.

In some implementations, external components such as threshold changeover switches, comparators, higher order filters, etc. for example are dispensed with for the signal evaluation. In addition, neither is a separate input necessary at the microcontroller for the timer system for transmitting the signal directly to the timer, nor are possible control lines for comparators or for switchable thresholds necessary. In addition to the omission of the external components, printed circuit board area may additionally be reduced as a result. Accordingly, by way of the described method, the signal evaluation can advantageously be realized accurately and robustly with a simultaneous reduction of the printed circuit board areas and a simplified structure as a whole can be realized as a result.

In some examples, the anti-aliasing filter is set in such a manner, on the basis of the signal to be detected, that the signal is damped as little as possible in the required frequency range and sufficiently high stop-band damping is present at the corresponding Nyquist frequency. The required frequency range is determined on the basis of the signal to be detected, so that the signal to be detected can advantageously be detected. The anti-aliasing filter may be set by way of a certain selection of the cut-off frequency. If, for example, the required frequency range (passband) is 50 kHz, the cut-off frequency of the anti-aliasing filter is set with 100 kHz, as a result of which the influence in the passband can be kept low (damping, phase rotation). According to this example, the stop-band damping should include at least 40 dB in order to suppress aliasing effects satisfactorily. Accordingly, a Nyquist frequency of 10 MHz and a sampling rate of the signal of at least 20 MHz result, in order to fulfill the Shannon theorem. Overall, the detected signal can advantageously be detected and evaluated well.

In some implementations, a time-equidistant sampling of the filtered signal can be carried out by way of the analog-to-digital converter. In this case, a sampling rate may be configured in such a manner in order to fulfill the prerequisites of the digital signal processing relating to a detection of a required signal passband. In some examples, the sampling rate is chosen in such a manner that the Nyquist-Shannon sampling theorem is fulfilled, as a result of which the detection of the required signal passband can be realized. As explained in the example presented above, for a Nyquist frequency of 10 MHz, a sampling rate of the signal of at least 20 MHz would accordingly be sufficient to fulfill the Nyquist-Shannon sampling theorem.

In some implementations, trigger times or trigger windows are defined by way of the timer system, during which the analog-to-digital converter digitizes the filtered signal and/or the discrete values are stored in the predefined memory area. According to this example, the timer system accordingly specifies trigger times or trigger windows, during which the filtered signal is digitized by way of the analog-to-digital converter. The trigger times or the trigger windows can accordingly represent relevant times or relevant windows for the signal evaluation for example, during which the signal evaluation or the storage or a digitization of the filtered signal should take place. According to this example, the discrete values which are digitized by way of the analog-to-digital converter can additionally only be stored in the predefined memory area if the timer system defines or specifies the corresponding trigger times or the trigger windows. According to this example, the required memory space for storing the discrete values can correspondingly be reduced. In addition, according to this example, it is possible by way of the timer system to actually specify during which time periods or during which times a corresponding signal evaluation can or should take place.

In some implementations, based on the results of the comparison transmitted to the timer system, a frequency and/or a load cycle of the signal for signal evaluation is determined by the timer system itself. According to this example, the timer system can already itself carry out a determination of the frequency and/or the load cycle of the filtered signal solely from the transmitted results of the comparison. The result of the comparison is for example 0 or 1 or over time a progression of 0 s and 1 s (for example: 0000,1111,0000). On the basis of the progression, the timer system can read the edges and the temporal length of individual plateaus, from which in turn the frequency and the load cycle of the signal can be determined.

In some examples, a frequency of the timer system is chosen in such a manner that the required temporal resolution of the signal can be achieved. If for example the signal to be detected has a frequency of 10 kHz and if a resolution of better than 1% should be achieved, the frequency of the timer system must include 1 MHz.

In some implementations, a temporal resolution of the timer system is configurable and is determined on the basis of an expected frequency and/or an expected load cycle of the signal to be measured. According to this example, the temporal resolution of the timer system is set sufficiently high for example, in order to be able to represent the frequency to be measured or the load cycle to be measured of the signal to be detected with the desired accuracy with the required tolerances. According to this example, the signal detection and the signal evaluation can accordingly be carried out accurately in an advantageous manner. In some examples, the resolution of the timer system is configurable on the basis of the microcontroller.

In some implementations, the microcontroller has at least one configurable digital hardware filter, by way of which band limitation and/or decimation of the discrete values is carried out prior to the storage of the same in the predefined memory area. The software computation time for signal evaluation and the required memory area for storing the discrete values can be minimized or reduced according to this example.

In some examples, frequency band limitation and/or decimation of the discrete values is carried out by a computer-implemented digital filter algorithm in a software unit. In some examples, this frequency band limitation and/or decimation of the discrete values by the computer-implemented digital filter algorithm can also take place prior to the storage of the discrete values in the predefined memory area. According to this example, noise filtering of the signal can be carried out accordingly. In addition, computation time and a required memory area can be minimized or reduced.

In some implementations, the evaluation of the discrete values stored in the predefined memory area is carried out by a computer-implemented method in a software unit. In this case, the discrete values stored in the predefined memory area are provided to the software unit and/or the frequency determined by the timer system and/or the determined load cycle are provided to the software unit. The software unit can correspondingly undertake the further evaluation of the signal on the basis of the stored discrete values and/or on the basis of the frequency determined by the timer system and/or the determined load cycle of the signal. According to this example, the signal evaluation is correspondingly carried out by the software unit on the basis of the provided values, in order, for example, to control a drivetrain of a vehicle.

In some implementations, the predefined threshold value or the predefined range is a programmable digital threshold value or a programmable digital range. The digital range may correspondingly form a digital limit band, on the basis of which the result of the comparison is determined. The programmable digital threshold value or the programmable digital range are for example programmed on the basis of the signal to be detected and stored in the microcontroller.

In some implementations, a defined PWM communication is effected on a plug interface between a charging column and a battery-powered vehicle using one of the previously mentioned methods.

Another aspect of the disclosure provides a device for the signal evaluation of a signal. The device has a signal detection unit for signal detection, a signal conditioning unit and a microcontroller. The signal is detected by way of the signal detection unit and provided via the signal conditioning unit, in which the signal is preprocessed, to a microcontroller for signal evaluation. The microcontroller has an analog-to-digital converter, a software unit and a timer system. The device according to this aspect is designed to execute one of the above-mentioned methods.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
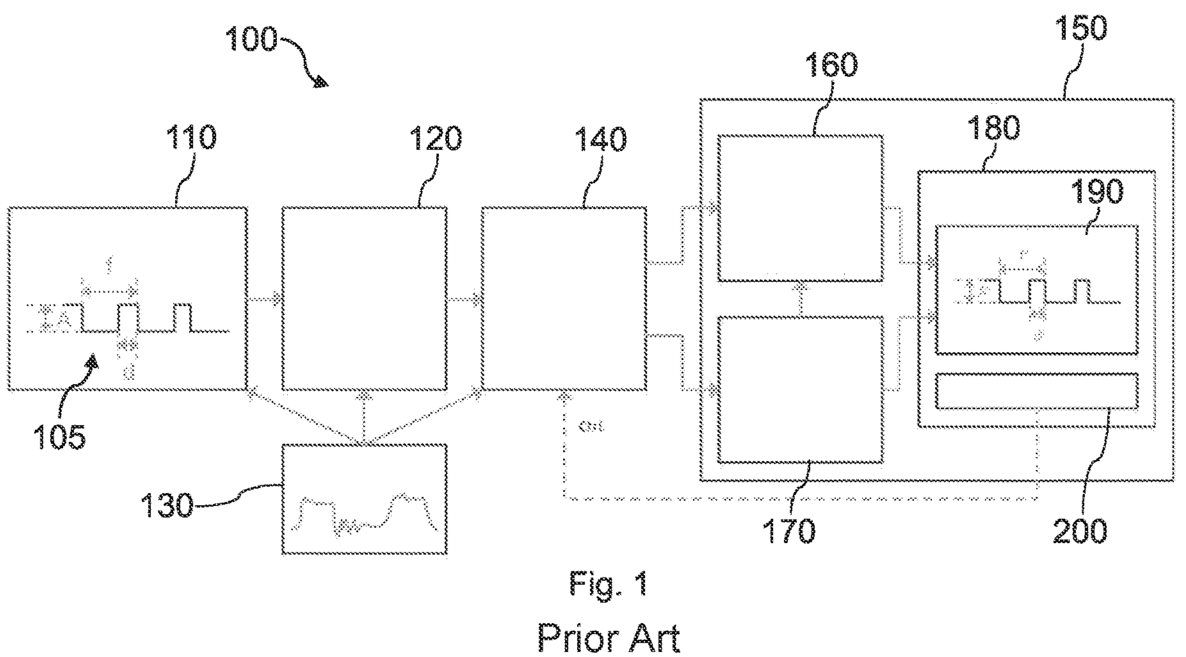
FIG. 1 shows a schematic illustration of a signal processing device according to the prior art.

FIG. 1 shows a signal processing device 100 as is used in the prior art. The signal processing device 100 is designed to evaluate a pulse-width modulated signal 105. Correspondingly, the pulse-width modulated signal 105 from a signal source 110 is first supplied by way of signal transmission 120 to a signal conditioning unit 140. During the detection of the signal 105 from the signal source 110, the signal transmission 120 and through the signal conditioning in the signal conditioning unit 140, interference 130 can affect the signal 105. In FIG. 1, the interference 130 is illustrated schematically. For example, the signal 105 is prefiltered by way of the signal conditioning unit 140. The filtered signal 105 is subsequently supplied from the signal conditioning unit 140 to a microcontroller 150. The microcontroller 150 has an analog-to-digital converter 160, a timer system 170 and a software unit 180. According to this example, the filtered signal from the signal conditioning unit 140 is supplied to the analog-to-digital converter 160 and the timer system 170 of the microcontroller 150 via separate PIN inputs. The timer system 170 can trigger the AD converter 160 to digitize the filtered signal. The digitized values from the AD converter 160 and data from the timer system 170 are supplied to the software unit 180 for evaluating the signal. The software unit 180 subsequently carries out a signal analysis 190 for evaluating the signal. In some examples, the signal conditioning unit 140 has an upstream input filter for the analog evaluation and required comparators for conditioning the signal, in order to be able to supply it to the timer system 170. In addition, the software unit 180 has a limit monitoring unit 200, which is designed to monitor a limit value or threshold value and possibly control the same in a function-dependent manner. The result of the monitoring can be supplied to the signal conditioning unit 140 or a switchover of the comparators of the signal conditioning unit 140 can be introduced.

Figure 2:
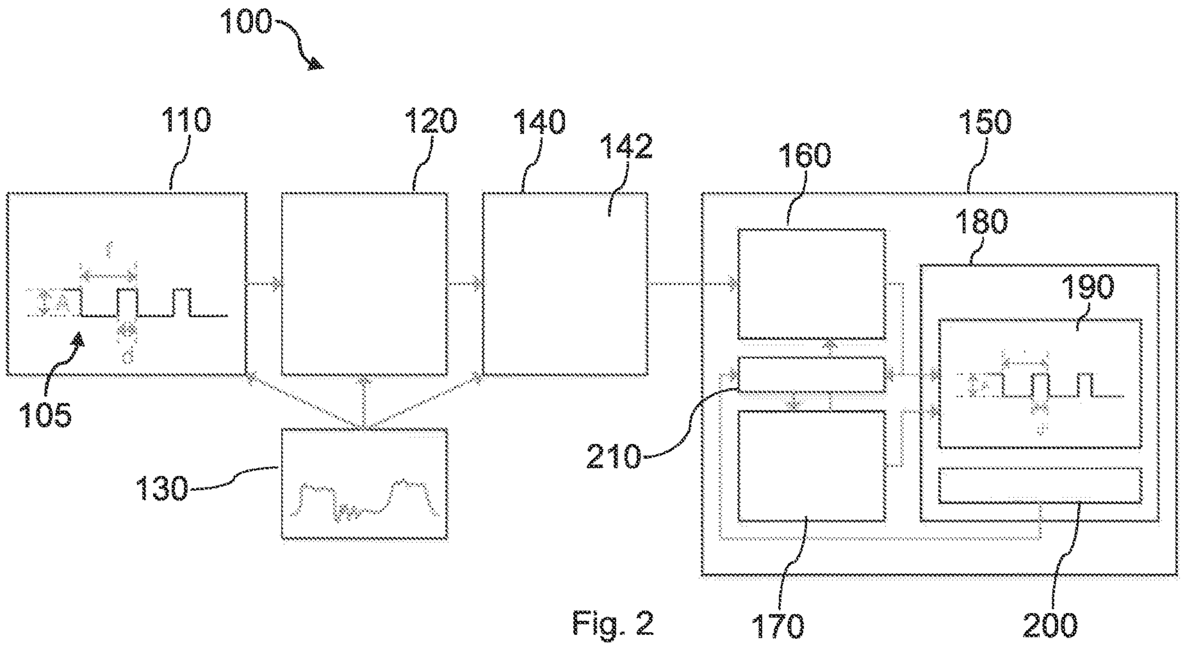
FIG. 2 shows a schematic illustration of an exemplary signal processing device.

FIG. 2 shows a signal processing device 100 according to an example of the present disclosure. The signal processing device 100 is likewise designed to evaluate a signal 105. Accordingly, the signal 105 from a signal source 110 is detected. The detected signal 105 is supplied by way of a signal transmission 120 to a signal conditioning unit 140. Interference 130 can occur during the signal detection at the signal source 110, the signal transmission 120 and/or in the signal conditioning unit 140. The interference 130 is illustrated schematically in FIG. 2. The signal conditioning unit 140 has an anti-aliasing filter 142 for filtering the signal 105. The filtered signal 105 is subsequently provided to a microcontroller 150 as part of the signal processing device 100 by way of a single input. The microcontroller 150 has an AD converter 160, a timer system 170, a software unit 180, a function for threshold value adaptation 200, which may possibly be required, and threshold detection 210. The function for threshold value adaptation 200, which may possibly be required, and the threshold detection 210 may be parts of the software unit 180. The filtered signal 105 is supplied to the AD converter 160. The AD converter 160 digitizes the filtered signal, as a result of which discrete values are generated. Subsequently, a comparison takes place of the discrete values that are generated with a predefined threshold value or range, where the comparison is carried out by way of the threshold value detection 210 as part of the software unit 180. In some examples, the threshold value detection 210 is a configurable digital comparator. The threshold value thereof is configured or possibly updated by way of the function for threshold value adaptation 200, which may be required. It compares the digitized analog value obtained from the AD converter 160 with its threshold value and transmits this with this result to the timer system 170. Subsequently, storage of the individual discrete values takes place in a predefined memory area of the signal processing device 100 if the individual discrete values are in each case greater than the predefined threshold value or the predefined range or fulfill a comparison criterion, where the storage is initiated by the timer system 170. The discrete values of the signal 105 stored in the predefined memory area of the signal processing device 100 are subsequently evaluated for evaluating the signal, for example to determine the frequency and/or the load cycle and/or the amplitude of the signal 105 by way of signal analysis 190.

In some examples, the anti-aliasing filter 142 is set in such a manner, on the basis of the signal 105 to be detected, that the signal 105 is damped as little as possible in the required relevant frequency range and has sufficiently high stop-band damping at the corresponding Nyquist frequency. The analog-to-digital converter 160 carries out a time equidistant sampling of the filtered signal, where the sampling rate is chosen in such a manner that a detection of the required signal passband is realized. In some examples, the timer system 170 can define trigger times or trigger windows, during which the analog-to-digital converter 160 digitizes the filtered signal 105 and/or the discrete values are stored in the predefined memory area.

In some implementations, the timer system 170 can already itself determine a frequency and/or a load cycle of the signal on the basis of the transmitted results of the comparison. The temporal resolution of the timer system 170 is determined on the basis of an expected frequency and/or an expected load cycle of the signal 105 to be measured. In some examples, the microcontroller has at least one configurable hardware filter, by way of which band limitation and/or decimation of the discrete values is carried out prior to the storage of the same in the predefined memory area. Accordingly, the required memory area can be reduced and the necessary computation power can likewise be reduced. In some examples, the software unit 180 has a computer-implemented digital filter algorithm, as a result of which a frequency band limitation and/or a decimation of the discrete values can be carried out. In some examples, the predefined threshold value or the predefined range are programmable digital threshold values or programmable digital ranges which can be programmed as a function of parameters. The predefined threshold value or the predefined range may correspondingly also be a characteristic map or a model. The signals evaluated by way of the signal processing device 100 may be used to control a drivetrain of a vehicle.

A number of implementations have been described. Nevertheless, it will be understood that various modifications may be made without departing from the spirit and scope of the disclosure. Accordingly, other implementations are within the scope of the following claims.

What is claimed is:

1. A method for evaluating a pulse-width modulated (PWM) signal, the PWM signal is provided from a signal source via a signal conditioning unit to a microcontroller for signal evaluation, the method includes:

- detecting the PWM signal from the signal source and transmitting the PWM signal to the signal conditioning unit having an anti-aliasing filter;
- filtering the PWM signal by the anti-aliasing filter, which is set based on the PWM signal to be detected, and providing the filtered PWM signal to the microcontroller; and
- processing the filtered PWM signal in the microcontroller, the filtered PWM signal is processed by:
  - digitizing the filtered PWM signal by an analog-to-digital converter, as a result of which discrete values are generated;
  - comparing the discrete values that are generated with a predefined threshold value or range, wherein the comparison is carried out by a configurable digital comparator;
  - transmitting the result of the comparison to a timer system;
  - determining, by the timer system, a frequency and/or a load cycle of the PWM signal based on the results of the comparison received from the configurable digital comparator;
  - storing the individual discrete values in a predefined memory area when the individual discrete values are in each case greater than the predefined threshold value or the predefined range or fulfill a comparison criterion, wherein the storage is initiated by the timer system based on the frequency and/or the load cycle of the PWM signal; and
- evaluating the discrete values of the PWM signal which are stored in the predefined memory area.

2. The method of claim 1, wherein the anti-aliasing filter is set in such a manner, based on the signal to be detected, that the signal is damped in the required frequency range and sufficiently high stop-band damping is present at the corresponding Nyquist frequency.

3. The method of claim 1, wherein time equidistant sampling of the filtered PWM signal is carried out by the analog-to-digital converter.

4. The method of claim 1, wherein trigger times or trigger windows are defined by the timer system, during which the analog-to-digital converter digitizes the filtered PWM signal and/or the discrete values are stored in the predefined memory area.

5. The method of claim 1, wherein a temporal resolution of the timer system is configurable and is determined based on an expected frequency and/or an expected load cycle of the signal to be measured.

6. The method of claim 1, wherein the microcontroller has at least one configurable digital hardware filter, by which band limitation and/or decimation of the discrete values is carried out prior to the storage of the same in the predefined memory area.

7. The method of claim 1, wherein frequency band limitation and/or decimation of the discrete values is carried out by a computer-implemented digital filter algorithm in a software unit.

8. The method of claim 1, wherein the evaluation of the discrete values stored in the predefined memory area is carried out by a computer-implemented method in a software unit, wherein the discrete values stored in the predefined memory area are provided to the software unit and/or wherein the frequency determined by the timer system and/or the determined load cycle are provided to the software unit.

9. The method of claim 1, wherein the predefined threshold value or the predefined range is a programmable digital threshold value or a programmable digital range.

10. A signal processing device for the signal evaluation of a signal, the signal processing device comprising:

- a signal detection unit detecting the signal;
- a signal conditioning unit; and
- a microcontroller receiving the signal from the signal conditioning unit for signal evaluation, the microcontroller comprising:
  - an analog-to-digital converter,
  - a digital comparator,
  - a software unit, and
  - a timer system, wherein the signal processing device is designed to execute the method of claim 1.

* * * * *